US012598807B2

(12) United States Patent
Fan et al.

(10) Patent No.: US 12,598,807 B2
(45) Date of Patent: Apr. 7, 2026

(54) THIN FILM TRANSISTORS HAVING FERROELECTRIC MATERIAL FOR PROVIDING PIXEL COMPENSATION

(71) Applicant: AUO Corporation, Hsinchu (TW)

(72) Inventors: Yang-Shun Fan, Hsinchu (TW);
Chen-Shuo Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 750 days.

(21) Appl. No.: 17/882,623

(22) Filed: Aug. 8, 2022

(65) Prior Publication Data

US 2023/0187455 A1 Jun. 15, 2023

Related U.S. Application Data

(60) Provisional application No. 63/287,695, filed on Dec. 9, 2021.

(30) Foreign Application Priority Data

Apr. 22, 2022 (TW) .................................. 111115389

(51) Int. Cl.
*H10D 86/40* (2025.01)
*H10D 30/01* (2025.01)
(Continued)

(52) U.S. Cl.
CPC ....... *H10D 86/431* (2025.01); *H10D 30/0415* (2025.01); *H10D 30/701* (2025.01);
(Continued)

(58) Field of Classification Search
CPC ............. H10D 30/0415; H10D 30/701; H10D 86/431; H10D 86/60
See application file for complete search history.

(56) References Cited

U.S. PATENT DOCUMENTS

2011/0049592 A1* 3/2011 Yoon ................... H10D 64/033
257/295
2017/0294456 A1 10/2017 Lee et al.
(Continued)

FOREIGN PATENT DOCUMENTS

CN 111554737 8/2020
CN 112701157 4/2021
(Continued)

*Primary Examiner* — Yara B Green
*Assistant Examiner* — Christopher M Roland
(74) *Attorney, Agent, or Firm* — JCIPRNET

(57) ABSTRACT
An active device substrate includes a substrate, a first semiconductor device and a second semiconductor device. The first semiconductor device and the second semiconductor device are disposed above the substrate. The first semiconductor device includes a first gate, a first semiconductor layer, a first source and a first drain. A first gate dielectric structure is sandwiched between the first gate and the first semiconductor layer. The first gate dielectric structure includes a stack of a portion of a gate dielectric layer and a portion of a ferroelectric material layer. The second semiconductor device is electrically connected to the first semiconductor device and includes a second gate, a second semiconductor layer, a second source and a second drain. Another part of the ferroelectric material layer is sandwiched between the second gate and the second semiconductor layer.

14 Claims, 14 Drawing Sheets

(51) Int. Cl.
   *H10D 30/69* (2025.01)
   *H10D 86/01* (2026.01)
   *H10D 86/60* (2025.01)

(52) U.S. Cl.
   CPC ......... *H10D 86/021* (2025.01); *H10D 86/423* (2025.01); *H10D 86/60* (2025.01)

(56) References Cited

U.S. PATENT DOCUMENTS

| | | | |
|---|---|---|---|
| 2018/0076238 A1* | 3/2018 | Lim | H10D 86/60 |
| 2019/0103493 A1* | 4/2019 | Tu | H10D 64/689 |
| 2019/0311756 A1* | 10/2019 | Sharma | H10D 64/033 |
| 2020/0013807 A1 | 1/2020 | Lee et al. | |
| 2020/0091160 A1 | 3/2020 | Ino et al. | |
| 2021/0118990 A1 | 4/2021 | Jo et al. | |
| 2021/0335837 A1 | 10/2021 | Lee et al. | |

FOREIGN PATENT DOCUMENTS

| | | |
|---|---|---|
| JP | 2007035839 | 2/2007 |
| KR | 20110021632 | 3/2011 |
| TW | 201803095 | 1/2018 |
| TW | 202013681 | 4/2020 |

* cited by examiner

THIN FILM TRANSISTORS HAVING FERROELECTRIC MATERIAL FOR PROVIDING PIXEL COMPENSATION

CROSS-REFERENCE TO RELATED APPLICATION

This application claims the priority benefit of U.S. provisional application Ser. No. 63/287,695, filed on Dec. 9, 2021 and Taiwan application serial no. 111115389, filed on Apr. 22, 2022. The entirety of each of the above-mentioned patent applications is hereby incorporated by reference herein and made a part of this specification.

BACKGROUND

Technical Field

The present invention is related to an active device substrate and a manufacturing method thereof.

Description of Related Art

The performance of thin film transistors including metal oxide semiconductors is prone to degradation after prolonged use because they are susceptible to the effects of oxygen, hydrogen and water in the environment, which in turn affect the electrical properties of the thin film transistors. For example, in a display device including a thin film transistor array, if the performance of the metal oxide semiconductor of some thin film transistors is degraded, it will cause the problem of mura in the picture displayed by the display device. Generally speaking, in order to reduce this mura problem, the pixel circuit is connected to the external chip, and a large amount of current data is stored in the external compensation memories. The aforementioned current data is calculated by an algorithm to obtain the compensation current or the compensation voltage, and then the compensation current or the compensation voltage is fed back to the pixel circuit. However, the circuit design of the external chip is complicated and the cost is high.

SUMMARY

The present invention provides an active device substrate, which can save the production cost of external memory.

The present invention provides a manufacturing method of an active device substrate, which can save the production cost of external memory.

At least one embodiment of the present invention provides an active device substrate. The active device substrate includes a substrate, a first semiconductor device and a second semiconductor device. The first semiconductor device and the second semiconductor device are disposed above the substrate. The first semiconductor device includes a first gate, a first semiconductor layer, a first source and a first drain. A gate dielectric structure is sandwiched between the first gate and the first semiconductor layer. The gate dielectric structure includes a stack of a portion of a gate dielectric layer and a portion of a ferroelectric material layer. The first source and first drain are electrically connected to the first semiconductor layer. The second semiconductor device is electrically connected to the first semiconductor device, and the second semiconductor device includes a second gate, a second semiconductor layer, a second source and a second drain. Another portion of the ferroelectric material layer is sandwiched between the second gate and the second semiconductor layer. The second source and second drain are electrically connected to the second semiconductor layer.

At least one embodiment of the present invention provides a manufacturing method of an active device substrate, including: forming a first semiconductor layer and a second semiconductor layer above the substrate; forming a gate dielectric layer on the first semiconductor layer; forming a ferroelectric material layer on the gate dielectric layer and the second semiconductor layer; forming a first gate and a second gate on the ferroelectric material layer, wherein the gate dielectric layer is located between the first gate and the first semiconductor layer, and the ferroelectric material layer is located between the first gate and the first semiconductor layer and between the second gate and the second semiconductor layer; forming a first source and a first drain that electrically connected to the first semiconductor layer; and forming a second source and a second drain electrically connected to the second semiconductor layer.

DESCRIPTION OF THE EMBODIMENTS

Figure 1:
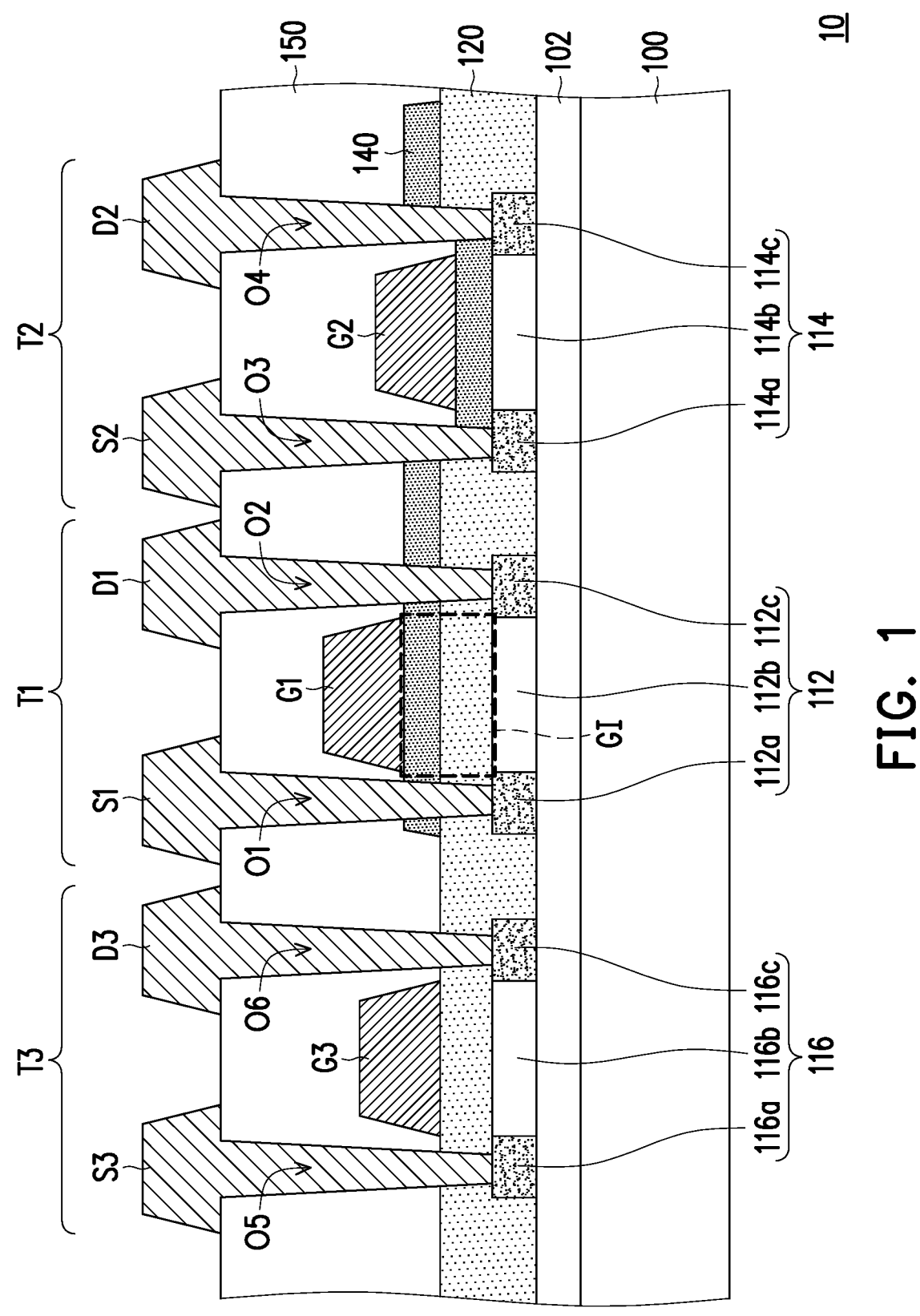
FIG. 1 is a cross-sectional schematic diagram of an active device substrate of an embodiment according to the present invention.

FIG. 1 is a cross-sectional schematic diagram of an active device substrate of an embodiment according to the present invention.

Referring to FIG. 1, the active device substrate 10 includes a substrate 100, a first semiconductor device T1 and a second semiconductor device T2. In this embodiment, the active device substrate 10 further includes a third semiconductor device T3 and a buffer layer 102. In some embodiments, the second semiconductor device T2 is electrically connected to the first semiconductor device T1 through a conductive member not shown in the figure. In some embodiments, the second semiconductor device T2 is electrically connected to the third semiconductor device T3 through a conductive member not shown in the figure. In some embodiments, the third semiconductor device T3 is electrically connected to the first semiconductor device T1 through a conductive member not shown in the figure.

The material of the substrate 100 may be glass, quartz, organic polymer or opaque/reflective material (e.g., conductive material, metal, wafer, ceramic or other suitable materials) or other suitable materials. If a conductive material or a metal is used, an insulating layer (not shown) is covered on the substrate 100 to avoid short circuit problems. In some embeddings, the substrate 100 is a flexible substrate, and the material of the substrate 100 is, for example, polyethylene terephthalate (PET), polyethylene naphthalate (PEN), polyester (PES), polymethylmethacrylate (PMMA), polycarbonate (PC), polyimide (PI) or metal foil or other flexible materials. A buffer layer 102 is located on the substrate 100, and the material of the buffer layer 102 may include silicon nitride, silicon oxide, silicon oxynitride or other suitable materials or a stack layer of the above materials, but the present invention is not limited thereto.

The first semiconductor device T1, the second semiconductor device T2 and the third semiconductor device T3 are disposed above the substrate 100 and the buffer layer 102. The first semiconductor device T1 includes a first gate G1, a first semiconductor layer 112, a first source S1 and a first drain D1. The second semiconductor device T2 includes a second gate G2.

a second semiconductor layer 114, a second source S2 and a second drain D2. The third semiconductor device T3 includes a third gate G3, a third semiconductor layer 116, a third source S3 and a third drain D3.

The first semiconductor layer 112, the second semiconductor layer 114 and the third semiconductor layer 116 are disposed on the substrate 100 and the buffer layer 102. The first semiconductor layer 112 includes a first source region 112a, a first drain region 112c, and a first channel region 112b located between the first source region 112a and the first drain region 112c. The second semiconductor layer 114 includes a second source region 114a, a second drain region 114c, and a second channel region 114b located between the second source region 114a and the second drain region 114c. The third semiconductor layer 116 includes a third source region 116a, a third drain region 116c, and a third channel region 116b located between the third source region 116a and the third drain region 116c.

The first gate G1 is overlapping with the first channel region 112b of the first semiconductor layer 112 in the normal direction ND of the top surface of the substrate 100, and a gate dielectric structure G1 is sandwiched between the first gate G1 and the first semiconductor layer 112. The gate dielectric structure includes a stack of a portion of the gate dielectric layer 120 and a portion of the ferroelectric material layer 140. The gate dielectric layer 120 covers the upper surface and sidewall of the first semiconductor layer 112, and the ferroelectric material layer 140 is located on the upper surface of the gate dielectric layer 120.

The second gate G2 is overlapping with the second channel region 114b of the second semiconductor layer 114 in the normal direction ND of the top surface of the substrate 100, and another portion of the ferroelectric material layer 140 is sandwiched between the second gate G2 and the second semiconductor layer 114. The gate dielectric layer 120 covers the sidewall of the second semiconductor layer 116, and the ferroelectric material layer 140 is in contact with the upper surface of the second semiconductor layer 114. In some embodiments, the ferroelectric material layer 140 is continuously extending from between the first gate G1 and the gate dielectric layer 120 to between the second gate G2 and the second semiconductor layer 114.

The third gate G3 is overlapping with the third channel region 116b of the third semiconductor layer 116 in the normal direction ND of the top surface of the substrate 100, and another portion of the gate dielectric layer 120 is sandwiched between the third gate G3 and the third semiconductor layer 116. The gate dielectric layer 120 covers the upper surface and sidewall of the third semiconductor layer 116.

In some embodiments, the distance between the first gate G1 and the first semiconductor layer 112 is greater than the distance between the second gate G2 and the second semiconductor layer 114 and the distance between the third gate G3 and the third semiconductor layer 116.

In an embodiment, the materials of the first semiconductor layer 112, the second semiconductor layer 114 and the third semiconductor layer 116 include monocrystalline silicon, polycrystalline silicon, microcrystalline silicon, organic semiconductor materials, and metal oxide semiconductor materials (e.g., indium gallium zinc oxide (IGZO), indium tin zinc oxide (ITZO), aluminum zinc tin oxide (AZTO), indium tungsten zinc oxide (IWZO) and other quaternary metal compounds or oxides composed of ternary metals including any three of gallium (Ga), zinc (Zn), indium (In), tin (Sn), aluminum (Al), and tungsten (W)) or other suitable materials. In some embodiments, the first semiconductor layer 112, the second semiconductor layer 114 and the third semiconductor layer 116 include materials with the same composition or different compositions. In some embodiments, first semiconductor layer 112, second semiconductor layer 114 and third semiconductor layer 116 include the same thickness or different thicknesses.

In an embodiment, the materials of the first gate G1, the second gate G2 and the third gate G3 may include metals, such as chromium (Cr), gold (Au), silver (Ag), copper (Cu), tin (Sn), lead (Pb), hafnium (Hf), tungsten (W), molybdenum (Mo), neodymium (Nd), titanium (Ti), tantalum (Ta), aluminum (Al), zinc (Zn) or alloys composed of any combination of the above metals or a stack of the above-mentioned metals and/or alloys, but the present invention is not limited thereto. Other conductive materials, such as metal nitrides, metal oxides, metal oxynitrides, stacked layers of metal and other conductive materials, or other conductive materials, can also be used as the first gate G1, the second gate G2 and the third gate G3. In some embodiments, the first gate G1, the second gate G2 and the third gate G3 include materials with the same composition or different compositions. In some embodiments, the first gate G1, the second gate G2 and the third gate G3 include the same thickness or different thicknesses.

In some embodiments, the material of the gate dielectric layer 120 is, for example, silicon oxide, silicon nitride, silicon oxynitride, or other suitable materials. In some embodiments, the thickness of the gate dielectric layer 120 is in a range from 50 nm to 100 nm.

In some embodiments, the material of the ferroelectric material layer 140 includes $Ni_xMg_yZn_{0.98-y}O$ or $Hf_zZr_{1-z}O_2$, wherein x is in a range from 0.01 to 0.05, y is in a range from 0.05 to 0.15, and z is in a range from 0.4 to 0.6. In some embodiments, the thickness of the ferroelectric material layer 140 is in a range from 5 nm to 50 nm.

The interlayer dielectric layer 150 is disposed above the first gate G1, the second gate G2, the third gate G3, the ferroelectric material layer 140 and the gate dielectric layer 120, and the interlayer dielectric layer 150 covers the first gate G1, the second gate G2, the third gate G3, the ferroelectric material layer 140 and the gate dielectric layer 120. The material of the interlayer dielectric layer 150 is, for example, silicon oxide, silicon nitride, silicon oxynitride or other suitable materials.

Openings O1 and O2 in the interlayer dielectric layer 150, the ferroelectric material layer 140 and the gate dielectric layer 120 are overlapping with the first source region 112a and the first drain region 112c, respectively. The first source S1 and the first drain D1 are located on the interlayer dielectric layer 150, and are respectively filled into the openings O1 and O2 to be electrically connected to the first source region 112a and the first drain region 112c of the first semiconductor layer 112.

Openings O3 and O4 in the interlayer dielectric layer 150, the ferroelectric material layer 140 and the gate dielectric layer 120 are overlapping with the second source region 114a and the second drain region 114c, respectively. The second source S2 and the second drain D2 are located on the interlayer dielectric layer 150 and are respectively filled into the openings O3 and O4 to be electrically connected to the second source region 114a and the second drain region 114c of the second semiconductor layer 114.

Although the ferroelectric material layer 140 is divided into a plurality of blocks by the first source S1, the first drain D1, the second source S2 and the second drain D2 in FIG. 1, it should be noted that the ferroelectric material layer 140 is actually a continuous structure. In other words, the ferroelectric material layer 140 surrounds the first source S1, the first drain D1, the second source S2 and the second drain D2, and the first source S1, the first drain D1, the second source S2 and the second drain D2 are penetrating through the ferroelectric material layer 140.

Openings O5 and O6 in the interlayer dielectric layer 150 and the gate dielectric layer 120 are overlapping with the third source region 116a and the third drain region 116c, respectively. The third source S3 and the third drain D3 are located on the interlayer dielectric layer 150 and are respectively filled into the openings O5 and O6 to be electrically connected to the third source region 116a and the third drain region 116c of the third semiconductor layer 116.

In an embodiment, the material of the first source S1, the first drain D1, the second source S2, the second drain D2, the third source S3 and the third drain D3 may include metal, such as chromium, gold, silver, copper, tin, lead, hafnium, tungsten, molybdenum, neodymium, titanium, tantalum, aluminum, zinc or alloys composed of any combination of the above metals or a stack of the above-mentioned metals and/or alloys, but the present invention is not limited thereto. Other conductive materials, such as metal nitrides, metal oxides, metal oxynitrides, stacked layers of metal and other conductive materials, or other conductive materials, can also be used as the first source S1, the first drain D1, the second source S2, the second drain D2, the third source S3 and the third drain D3. In some embodiments, the first source S1, the first drain D1, the second source S2, the second drain D2, the third source S3 and the third drain D3 include materials with the same composition or different compositions. In some embodiments, the first source S1, the first drain D1, the second source S2, the second drain D2, the third source S3 and the third drain D3 include the same thickness or different thicknesses.

Based on the above, the gate dielectric structure G1 between the first gate G1 and the first semiconductor layer 112 of the first semiconductor device T1 includes the gate dielectric layer 120 and the ferroelectric material layer 140. Therefore, the sub-threshold swing of the first semiconductor element T1 can be less than 60 mV/dec through the negative capacitor effect, and the hysteresis effect of the ferroelectric material layer 140 between the first gate G1 and the first semiconductor layer 112 is reduced. In addition, the ferroelectric material layer 140 is sandwiched between the second gate G2 and the second semiconductor layer 116 of the second semiconductor device T2. Therefore, in addition to being used as a driver element, the second semiconductor element T2 also has the function of storing current information or voltage information. At last, a gate dielectric layer 120 sandwiched between the third gate G3 and the third semiconductor layer 116 of the third device T3 may provide a stable forward or reverse current.

FIG. 2A to FIG. 2F are cross-sectional schematic diagrams of the manufacturing method of the active device substrate 10 of FIG. 1.

Figure 2A:
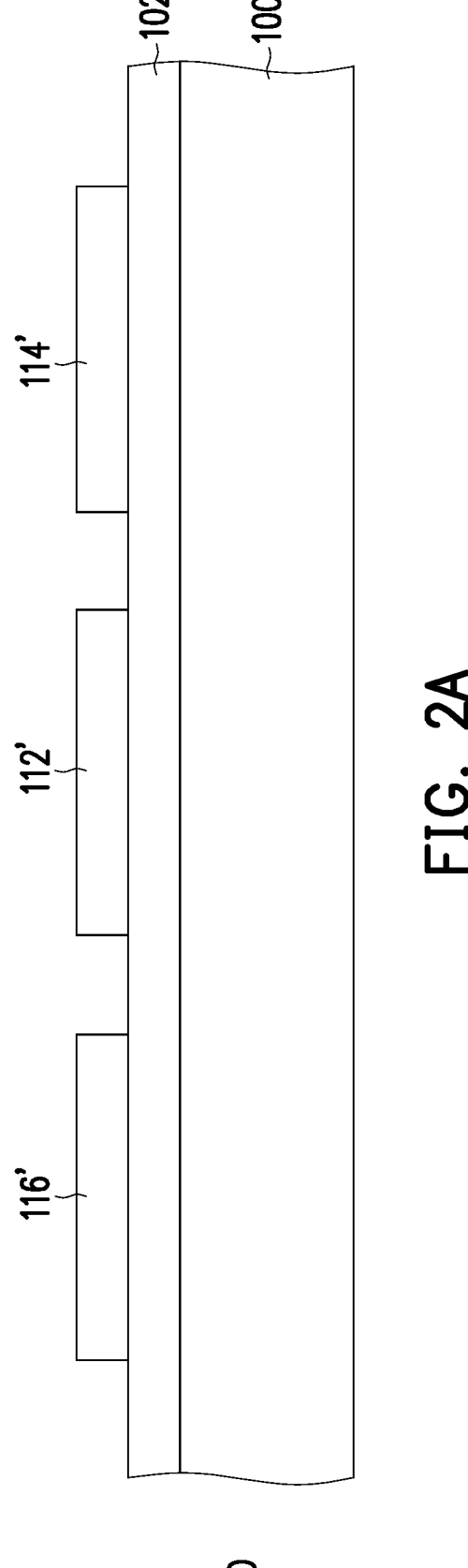
FIG. 2A to FIG. 2F are cross-sectional schematic diagrams of the manufacturing method of the active device substrate of FIG. 1.

Referring to FIG. 2A, a first semiconductor layer 112', a second semiconductor layer 114' and a third semiconductor layer 116' are formed above the substrate 100. In this embodiment, the first semiconductor layer 112', the second semiconductor layer 114' and the third semiconductor layer 116' are formed on the buffer layer 102. In some embodiments, the method of forming the first semiconductor layer 112', the second semiconductor layer 114' and the third semiconductor layer 116' includes the following steps: first, a semiconductor material layer (not shown) is blanket-formed on the substrate 110 and the buffer layer 102; then, a patterned photoresist (not shown) is formed on the semiconductor material layer by a lithography process; next, a wet or dry etching process is performed on the semiconductor material layer by using the patterned photoresist as a mask to form the first semiconductor layer 112', the second semiconductor layer 114' and the third semiconductor layer 116'; after that, the patterned photoresist is removed. In other words, the first semiconductor layer 112', the second semiconductor layer 114' and the third semiconductor layer 116' are formed simultaneously, for example.

Figure 2B:
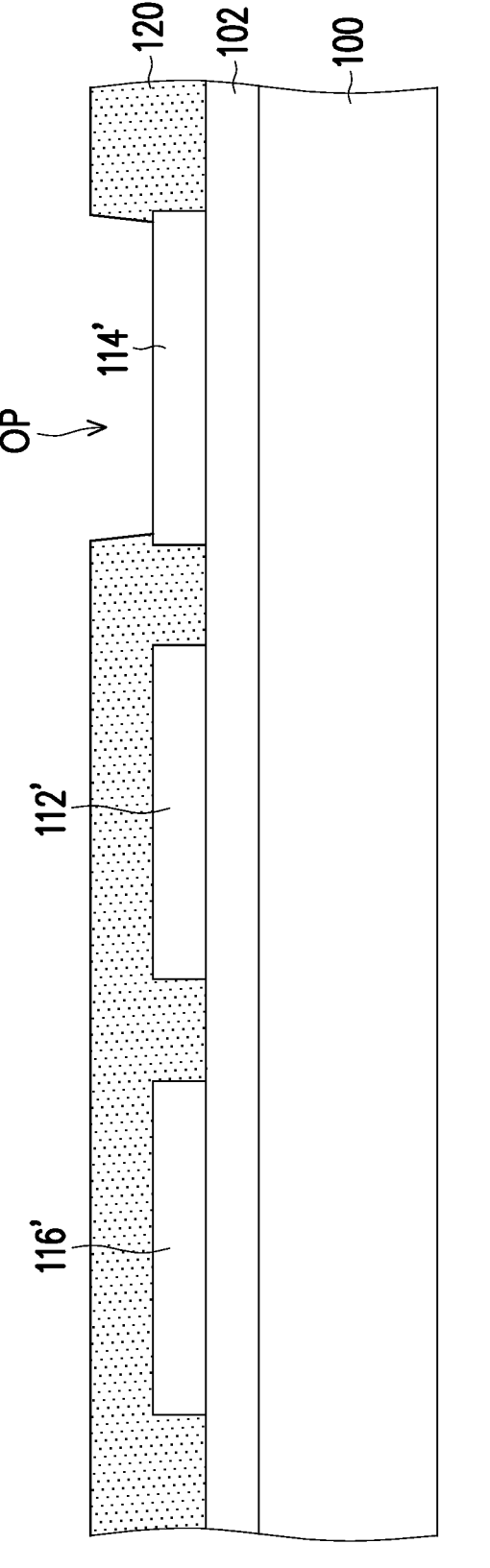

Referring to FIG. 2B, a gate dielectric layer 120 is formed on the first semiconductor layer 112' and the third semiconductor layer 116'. In some embodiments, the method of forming the gate dielectric layer 120 includes the following steps: first, a dielectric material layer (not shown) is blanket-formed on the first semiconductor layer 112', the second semiconductor layer 114', the third semiconductor layer 116' and the buffer layer 102'; then, a patterned photoresist (not shown) is formed on the dielectric material layer by a lithography process; next, a wet or dry etching process is performed on the dielectric material layer by using the patterned photoresist as a mask to form the gate dielectric layer 120 including the opening OP, wherein the opening OP exposes the second semiconductor layer 114'; after that, the patterned photoresist is removed. In some embodiments, the length of the opening OP is less than the length of the second semiconductor layer 114', and the gate dielectric layer 120 covers the sidewall and portion surface of the second semiconductor layer 114'. In some embodiments, the length of the opening OP is greater than the length of the second semiconductor layer 114', and the gate dielectric layer 120 is not in contact with the second semiconductor layer 114'. In some embodiments, the material of the gate dielectric layer 120 may be a oxide without hydrogen, thereby preventing the problems that hydrogen atoms in the gate dielectric layer 120 diffuse into the first semiconductor layer 112', the second semiconductor layer 114' and the third semiconductor layer during the process layer 116'.

Figure 2C:
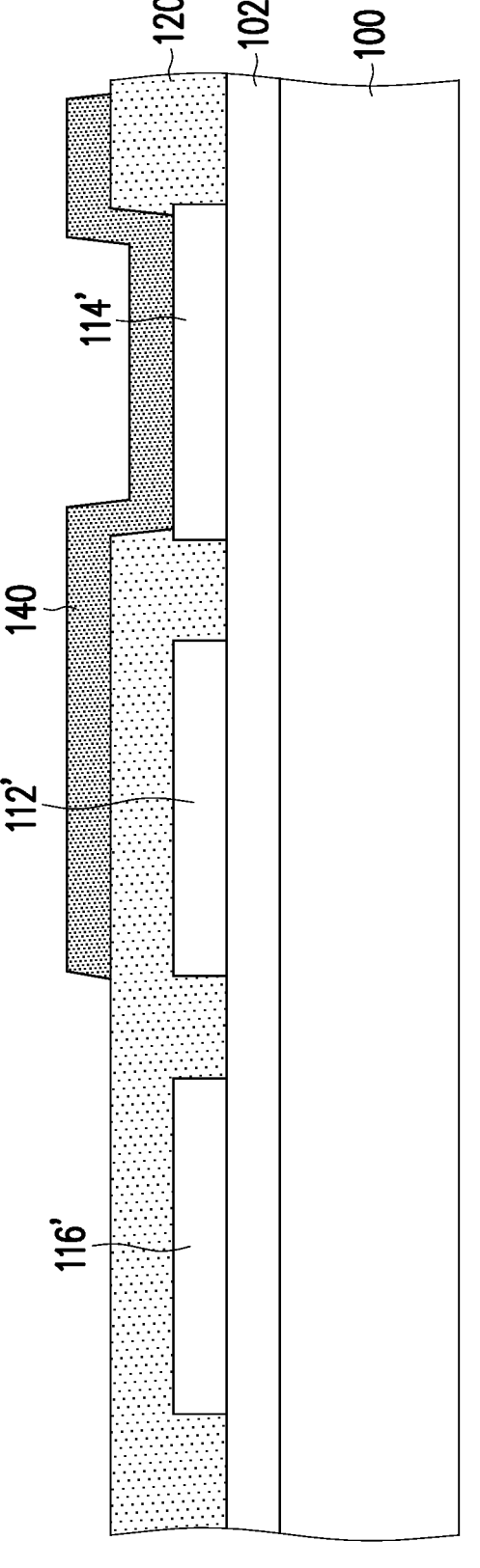

Referring to FIG. 2C, a ferroelectric material layer 140 is formed on the gate dielectric layer 120 and the second semiconductor layer 114'. The ferroelectric material layer 140 is filled into the opening OP of the gate dielectric layer 120 and is in contact with the second semiconductor layer 114'. In some embodiments, the method of forming the ferroelectric material layer 140 includes the following steps: first, a ferroelectric material layer (not shown) is blanked-formed on the gate dielectric layer 120 and the second semiconductor layer 114'; then, a patterned photoresist (not shown) is formed on the ferroelectric material layer by a lithography process; next, a wet or dry etching process is performed on the ferroelectric material layer by using the patterned photoresist as a mask to form the ferroelectric material layer 140 which is not overlapping with the third semiconductor layer 116'; after that, the patterned photoresist is removed.

Figure 2D:
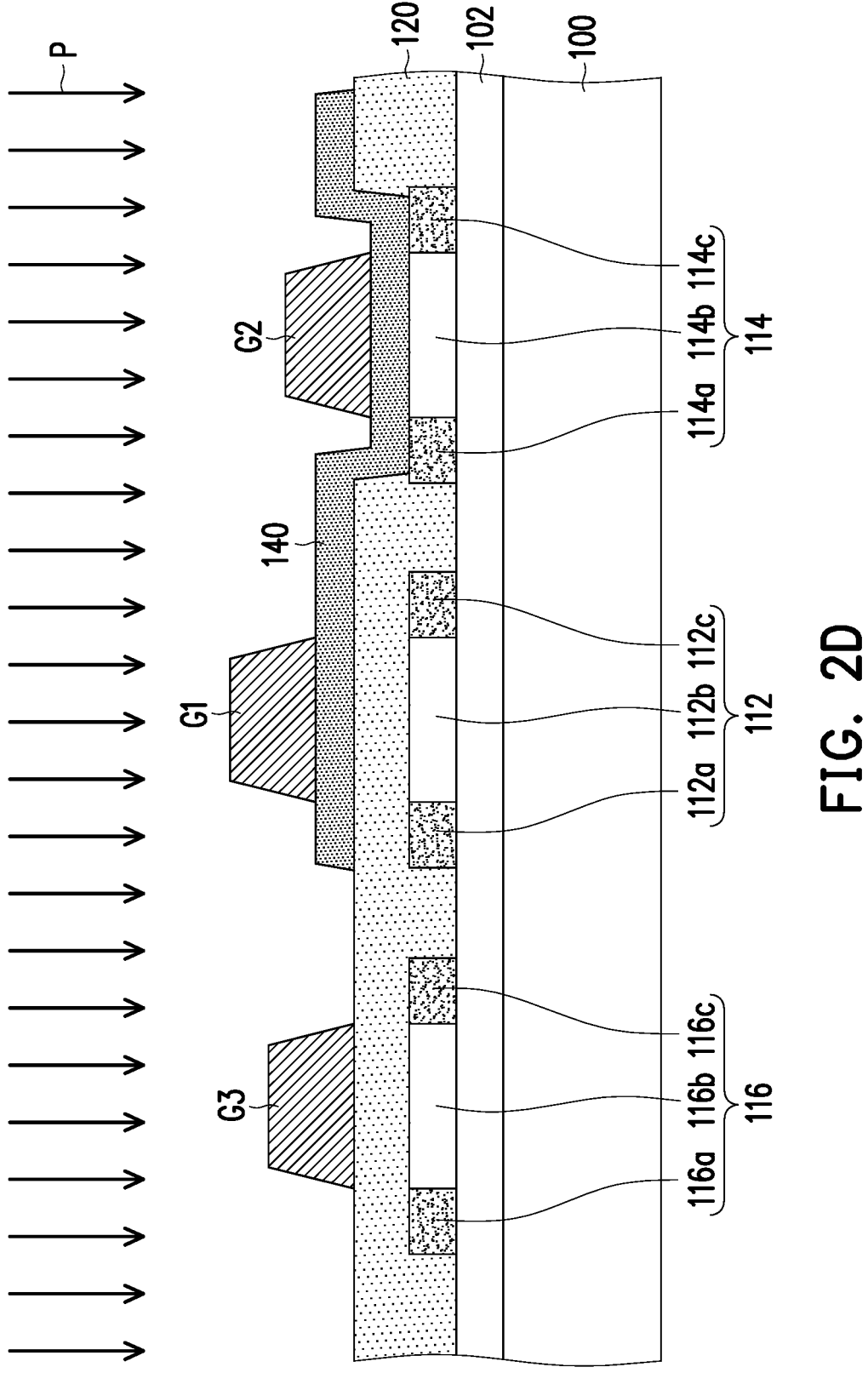

Referring to FIG. 2D, the first gate G1 and the second gate G2 are formed on the ferroelectric material layer 140, and the third gate G3 is formed on the gate dielectric layer 120. The gate dielectric layer 120 is located between the first gate G1 and the first semiconductor layer 112 and between the third gate G3 and the third semiconductor layer 116, and the ferroelectric material layer 140 is located between the first gate G1 and the first semiconductor layer 112 and between the second gate G2 and the second semiconductor layer between 114. In some embodiments, the method of forming the first gate G1, the second gate G2 and the third gate G3 includes the following steps: first, a conductive material layer (not shown) is blanket-formed on the gate dielectric layer 120 and the ferroelectric material layer 140; then, a patterned photoresist (not shown) is formed on the conductive material layer by a lithography process; next, a wet or dry etching is performed on the conductive material layer by using the patterned photoresist as a mask to form the first gate G1, the second gate G2 and the third gate G3; after that, the patterned photoresist is removed. In other words, the first gate G1, the second gate G2 and the third gate G3 are formed at the same time, for example.

Continuing from the previous, a doping process P is performed on the first semiconductor layer 112', the second semiconductor layer 114' and the third semiconductor layer 116' by using the first gate G1, the second gate G2 and the third gate G3 as a mask to form the first semiconductor layer 112 including a first source region 112a, a first channel region 112b and the first drain region 112c, the second semiconductor layer 114 including the second source region 114a, the second channel region 114b and the second drain region 114c, and the third semiconductor layer 116 including the third source region 116a, the third channel region 116b and the third drain region 116c. In some embodiments, the doping process P includes a hydrogen plasma process or an ion implantation process.

Figure 2E:
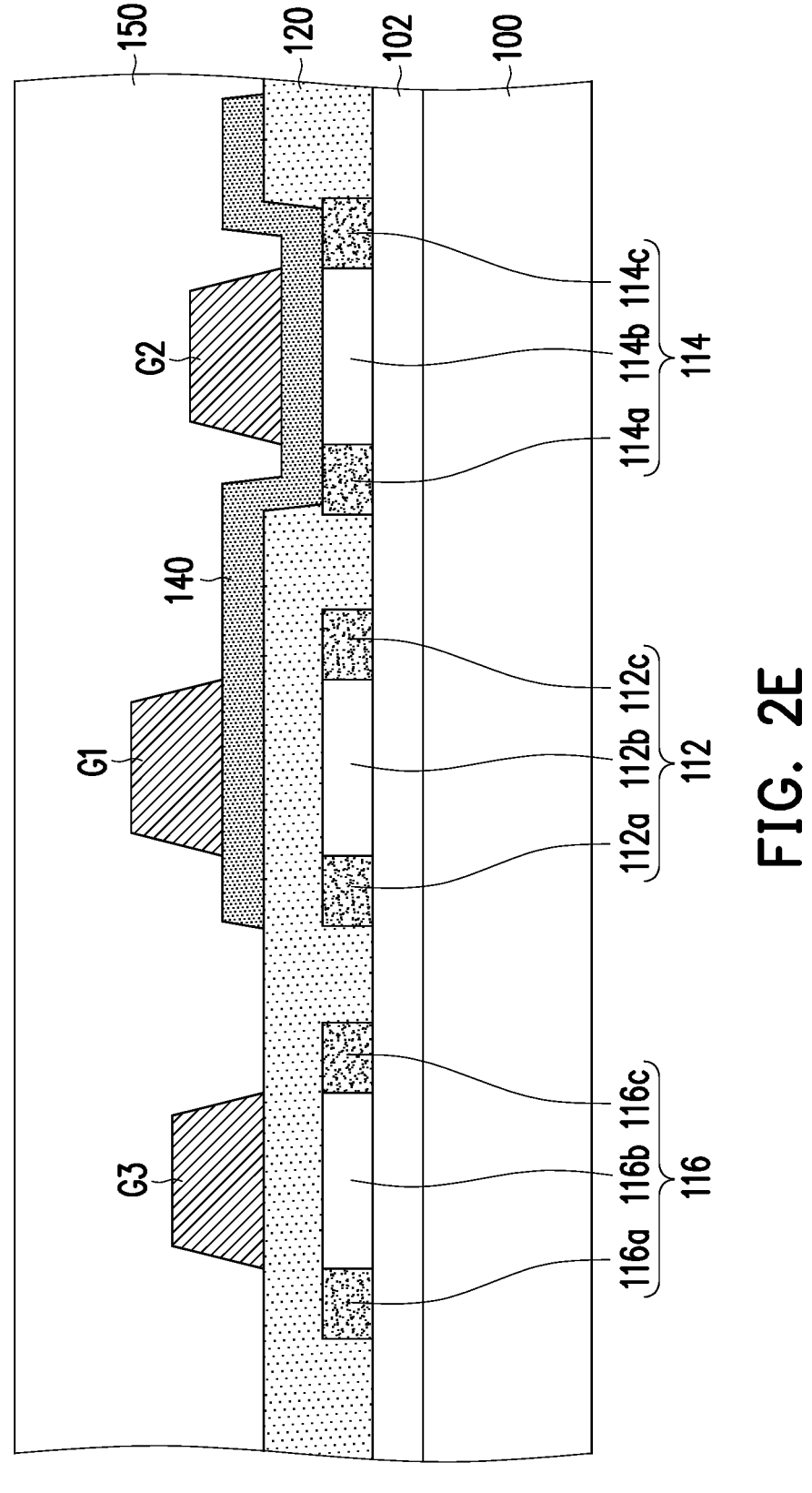

Referring to FIG. 2E, an interlayer dielectric layer 150 is formed above the gate dielectric layer 120 and the ferroelectric material layer 140. In some embodiments, the interlayer dielectric layer 150 is an insulating layer without hydrogen, thereby preventing the problems that hydrogen atoms in the interlayer dielectric layer 150 diffuse into the first semiconductor layer 112, the second semiconductor layer 114 and the third semiconductor layer 116, but the present invention is not limited thereto. In some embodiments, the interlayer dielectric layer 150 contains hydrogen atoms. Therefore, hydrogen atoms can diffuse into the first semiconductor layer 112, the second semiconductor layer 114 and the third semiconductor layer 116 by heat treatment to adjust resistivity of the first semiconductor layer 112, the second semiconductor layer 114 and the third semiconductor layer 116. In some embodiments, the doping process P shown in FIG. 2D may be omitted when the first semiconductor layer 112, the second semiconductor layer 114 and the third semiconductor layer 116 are doped by hydrogen atoms in the interlayer dielectric layer 150.

Figure 2F:
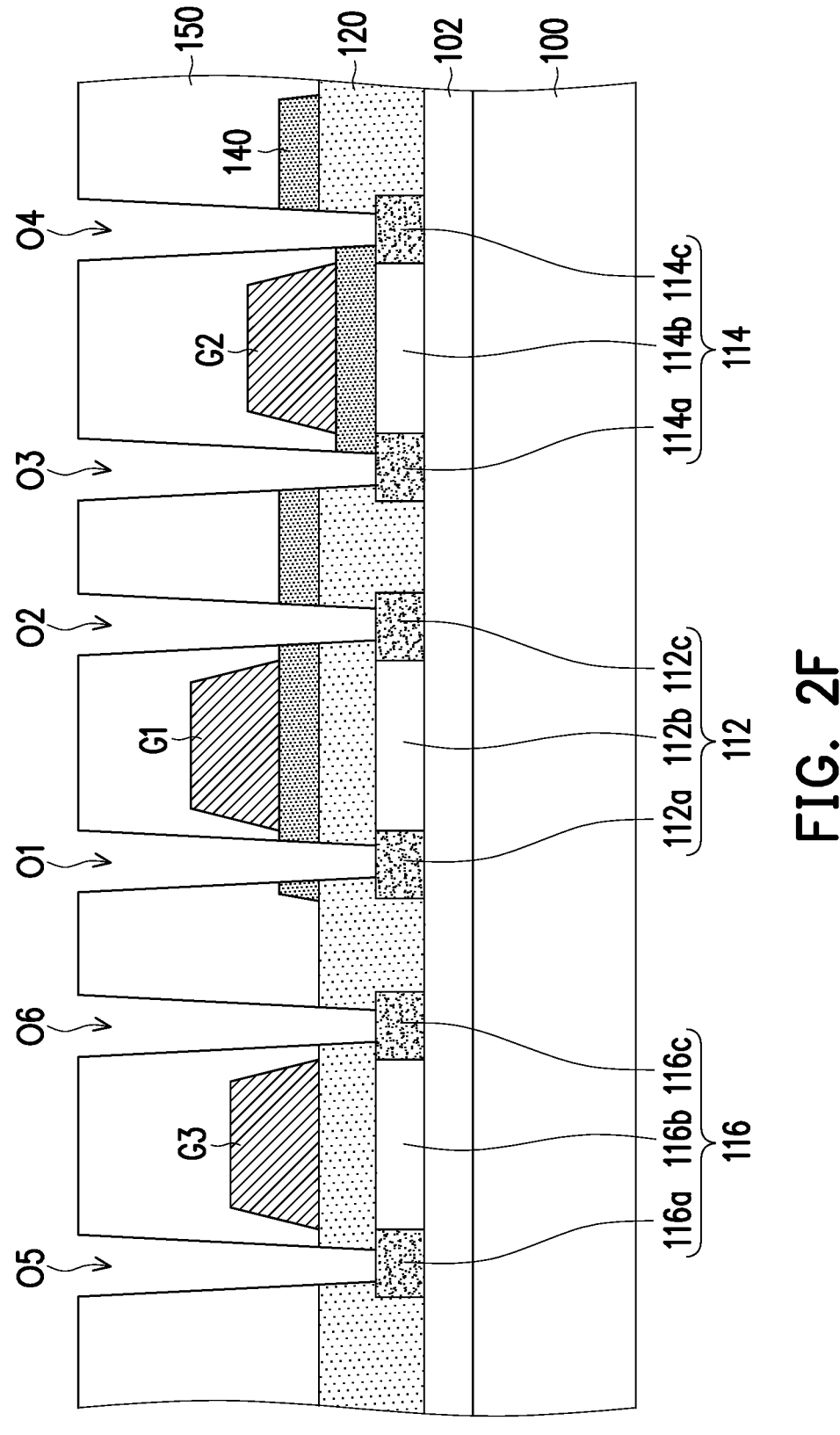

Referring to FIG. 2F, openings O1, O2, O3, O4, O5, O6 are formed by the method including the following steps: first, a patterned photoresist (not shown) is formed on the interlayer dielectric layer 150 by a lithography process; then, a wet or dry etching process is performed by using the patterned photoresist as a mask to form openings O1, O2, O3, O4, O5, O6 in the interlayer dielectric layer 150, the ferroelectric material layer 140 and the gate dielectric layer 120; after that the patterned photoresist is removed.

The openings O1 and O2 are penetrating through the interlayer dielectric layer 150, the ferroelectric material layer 140 and the gate dielectric layer 120 to expose the first source region 112a and the first drain region 112c of the first semiconductor layer 112, respectively. The openings O3 and O4 are penetrating through the interlayer dielectric layer 150, the ferroelectric material layer 140 and the gate dielectric layer 120 to expose the second source region 114a and the second drain region 114c of the second semiconductor layer 114, respectively. The openings O5 and O6 are penetrating through the interlayer dielectric layer 150 and the gate dielectric layer 120 to expose the third source region 116a and the third drain region 116c of the third semiconductor layer 116, respectively.

At last, returning to FIG. 1, the first source S1, the first drain D1, the second source S2, the second drain D2, the third source S3 and the third drain D3 are formed on the interlayer dielectric layer 150. The first source S1 and the first drain D1 are respectively filled into the openings O1 and O2. The second source S2 and the second drain D2 are respectively filled into the openings O3 and O4. The third source S3 and the third drain D3 are respectively filled into the openings O5 and O6. In some embodiments, the method of forming the first source S1, the first drain D1, the second source S2, the second drain D2, the third source S3 and the third drain D3 includes the following steps: first, a conductive material layer (not shown) is blanket-formed on the interlayer dielectric layer 150; then, a patterned photoresist (not shown) is formed on the conductive material layer by a lithography process; next, a wet or dry etching process is performed on the conductive material layer by using the patterned photoresist as a mask to form the first source S1, the first drain D1, the second source S2, the second drain D2, the third source S3 and the third drain D3; after that, the patterned photoresist is removed. In other words, the first source S1, the first drain D1, the second source S2, the second drain D2, the third source S3 and the third drain D3 are formed at the same time, for example.

After the above processes, the fabrication of the active device substrate 10 is substantially completed.

Figure 3:
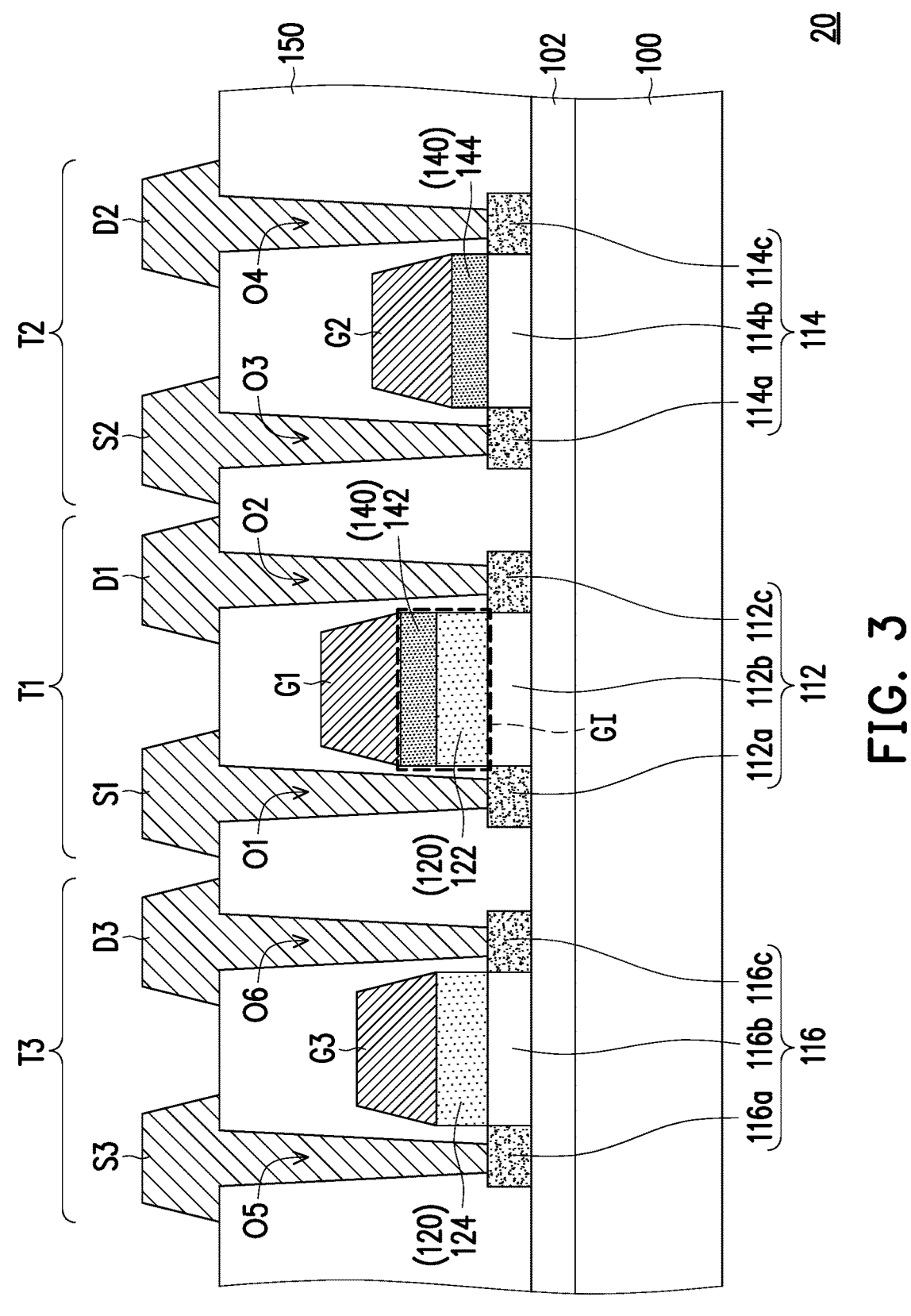
FIG. 3 is a cross-sectional schematic diagram of an active device substrate of an embodiment according to the present invention.

FIG. 3 is a cross-sectional schematic diagram of an active device substrate 20 according to an embodiment of the present invention. It should be noted herein that, in embodiments provided in FIG. 3, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

The main difference between the active device substrate 20 of FIG. 3 and the active device substrate 10 of FIG. 1 is that: the gate dielectric layer 120 of the active device substrate 20 is aligned with the first channel region 112b and the third channel region 116b, and the ferroelectric material layer 140 is aligned with the first channel region 112b and second channel region 114b.

Referring to FIG. 3, the gate dielectric layer 120 includes a first gate dielectric pattern 122 and a second gate dielectric pattern 124, wherein the first gate dielectric pattern 122 and the second gate dielectric pattern 124 are separated from each other. The ferroelectric material layer 140 includes a first ferroelectric material pattern 142 and a second ferroelectric material pattern 144, wherein the first ferroelectric material pattern 142 and the second ferroelectric material pattern 144 are separated from each other.

The first gate dielectric pattern 122 and the first ferroelectric material pattern 142 are overlapping with the first gate G1 and the first channel region 112$b$ in the normal direction ND of the top surface of the substrate 100, and the first gate dielectric pattern 122 and the first ferroelectric material pattern 142 are located between the first gate G1 and the first channel region 112$b$ to constitute a gate dielectric structure G1. The sidewall of the first gate dielectric pattern 122 and the sidewall of the first ferroelectric material pattern 142 are aligned with the sidewall of the first gate G1.

The second ferroelectric material pattern 144 is overlapping with the second gate G2 and the second channel region 114$b$ in the normal direction ND of the top surface of the substrate 100, and the second ferroelectric material pattern 144 is located between the second gate G2 and the second channel region 114$b$. The sidewall of the second ferroelectric material pattern 144 is aligned with the sidewall of the second gate G2.

The second gate dielectric pattern 124 is overlapping with the third gate G3 and the third channel region 116$b$ in the normal direction ND of the top surface of the substrate 100, and the second gate dielectric pattern 124 is located between the third gate G3 and the third channel region 116$b$. The sidewall of the second gate dielectric pattern 124 is aligned with the sidewall of the third gate G3.

In this embodiment, the gate dielectric layer 120 and the ferroelectric material layer 140 are not overlapping with the first source region 112$a$, the first drain region 112$c$, the second source region 114$a$, the second drain region 114$c$, the third source region 116$a$ and the third drain region 116$c$. Therefore, the gate dielectric layer 120 and the ferroelectric material layer 140 can be prevented from affecting the doping concentration of the first source region 112$a$, the first drain region 112$c$, the second source region 114$a$, the second drain region 114$c$, the third source region 116$a$ and the third drain region 116$c$, and the negative effects of the doping process on the gate dielectric layer 120 and ferroelectric material layer 140 can also be avoided.

FIG. 4A to FIG. 4D are cross-sectional schematic diagrams of the manufacturing method of the active device substrate of FIG. 3.

Figure 4A:
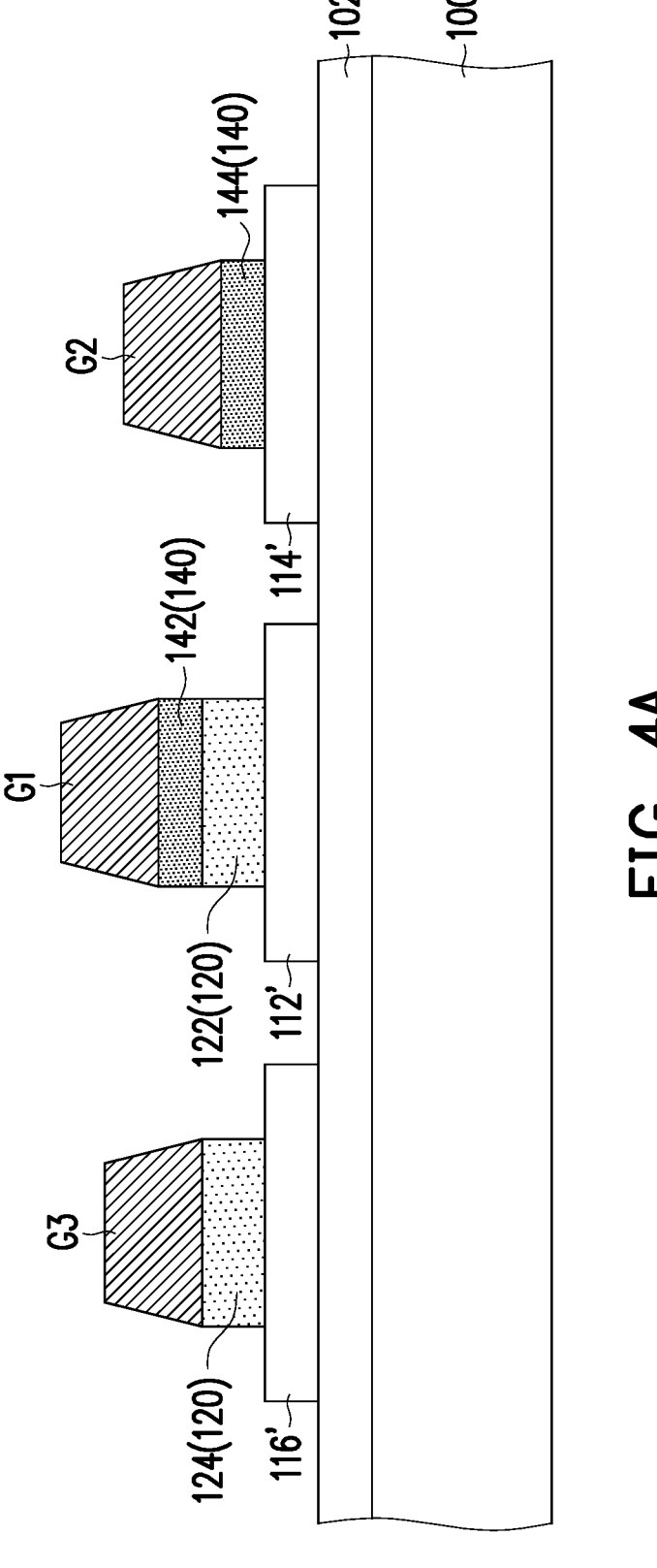
FIG. 4A to FIG. 4D are cross-sectional schematic diagrams of the manufacturing method of the active device substrate of FIG. 3.

Referring to FIG. 4A, following the step of FIG. 2C, the first gate G1 and the second gate G2 are formed on the ferroelectric material layer 140, and the third gate G3 is formed on the gate dielectric layer 120. Then, using the first gate G1, the second gate G2 and the third gate G3 as a mask, the gate dielectric layer 120 and the ferroelectric material layer 140 are patterned to form the first gate dielectric pattern 122, the second gate dielectric pattern 124, the first ferroelectric material pattern 142 and the second ferroelectric material pattern 144.

Figure 4B:
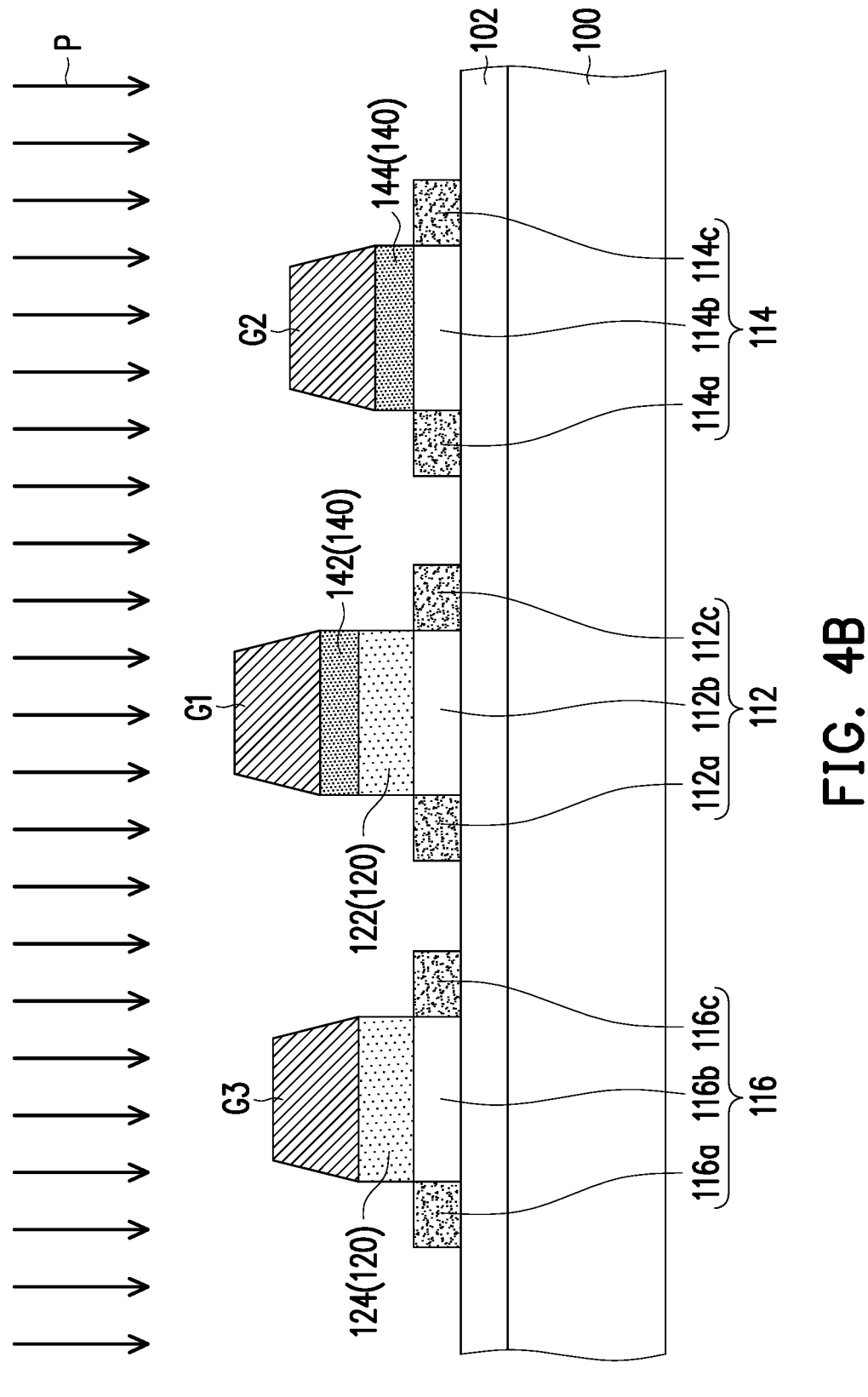

Next, referring to FIG. 4B, using the first gate G1, the second gate G2 and the third gate G3 as a mask, a doping process P is performed on the first semiconductor layer 112', the second semiconductor layer 114' and the third semiconductor layer 116' to form the first semiconductor layer 112 including the first source region 112$a$, the first channel region 112$b$ and the first drain region 112$c$, the second semiconductor layer 114 including the second source region 114$a$, the second channel region 114$b$ and the second drain region 114$c$, and the third semiconductor layer 116 including the third source region 116$a$, the third channel region 116$b$ and the third drain region 116$c$. In some embodiments, the doping process P includes a hydrogen plasma process or an ion implantation process.

Figure 4C:
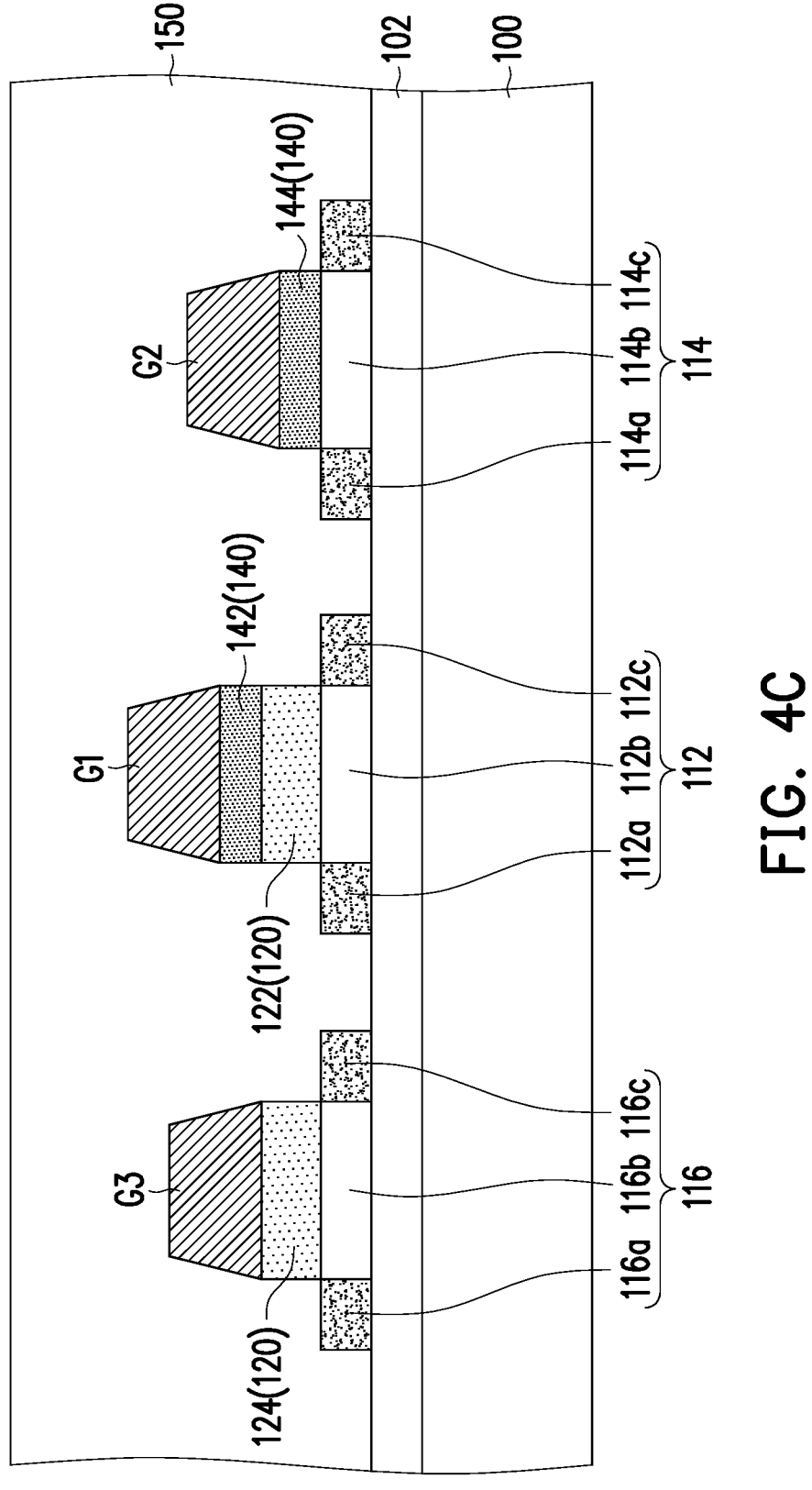

Referring to FIG. 4C, an interlayer dielectric layer 150 is formed above the gate dielectric layer 120 and the ferroelectric material layer 140. The interlayer dielectric layer 150 is in contact with the first source region 112$a$, the first drain region 112$c$, the second source region 114$a$, the second drain region 114$c$, the third source region 116$a$ and the third drain region 116$c$. In some embodiments, the interlayer dielectric layer 150 contains hydrogen atoms. Therefore, hydrogen atoms can diffuse into the first semiconductor layer 112, the second semiconductor layer 114 and the third semiconductor layer 116 by heat treatment to adjust the resistivity of the first semiconductor layer 112, the second semiconductor layer 114 and the third semiconductor layer 116. In some embodiments, the doping process is performed by using hydrogen atoms in the interlayer dielectric layer 150, so the doping process P of FIG. 4B can be omitted.

Figure 4D:
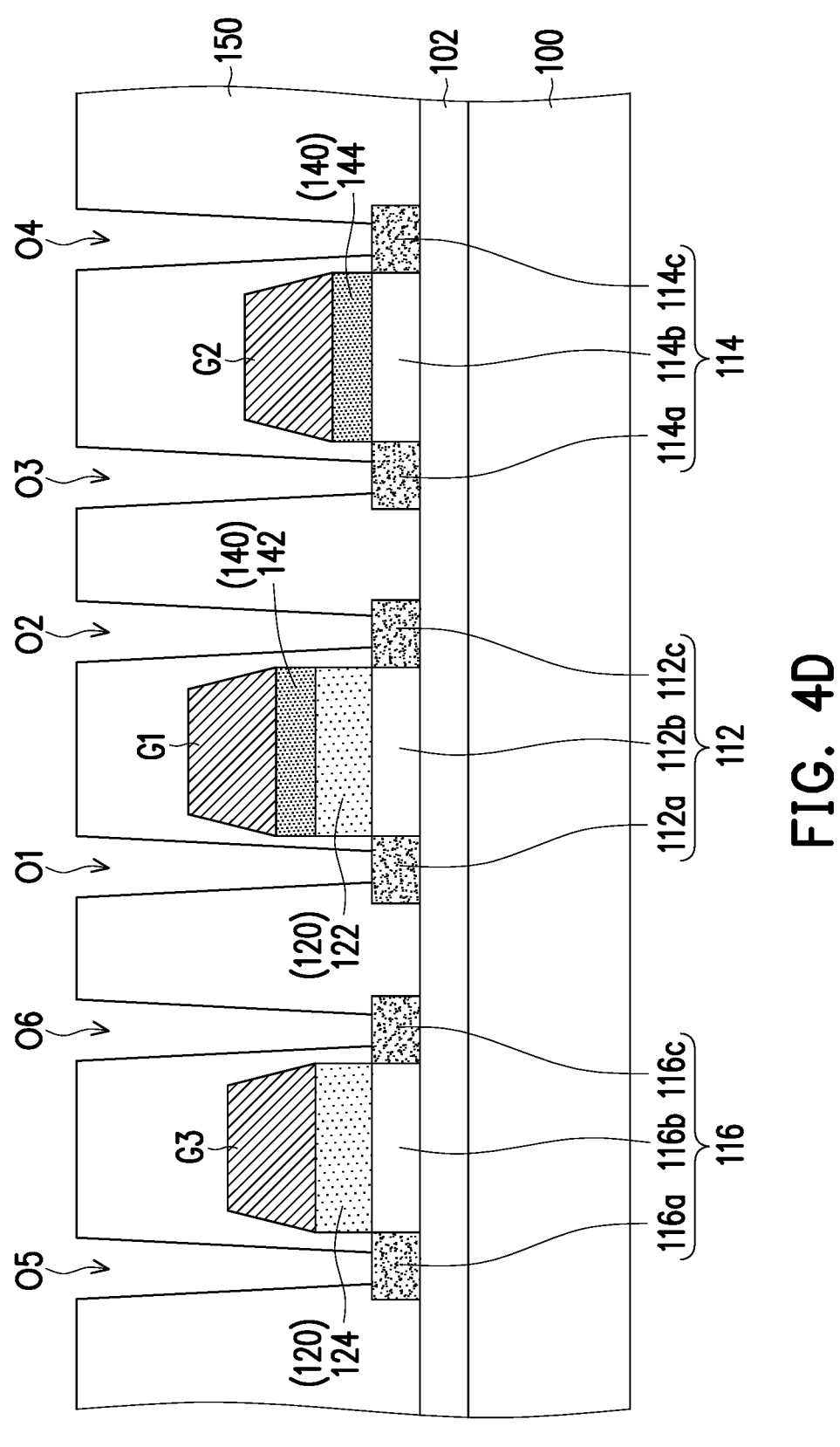

Referring to FIG. 4D, the openings O1, O2, O3, O4, O5 and O6 are formed in the interlayer dielectric layer 150.

At last, returning to FIG. 3, the first source S1, the first drain D1, the second source S2, the second drain D2, the third source S3 and the third drain D3 are formed on the interlayer dielectric layer 150. The first source S1 and the first drain D1 are respectively filled into the openings O1 and O2 to be electrically connected to the first source region 112$a$ and the first drain region 112$c$ of the first semiconductor layer 112. The second source S2 and the second drain D2 are respectively filled into the openings O3 and O4 to be electrically connected to the second source region 114$a$ and the second drain region 114$c$ of the second semiconductor layer 114. The third source S3 and the third drain D3 are respectively filled into the openings O5 and O6 to be electrically connected to the third source region 116$a$ and the third drain region 116$c$ of the third semiconductor layer 116.

After the above processes, the fabrication of the active device substrate 20 is substantially completed.

Figure 5:
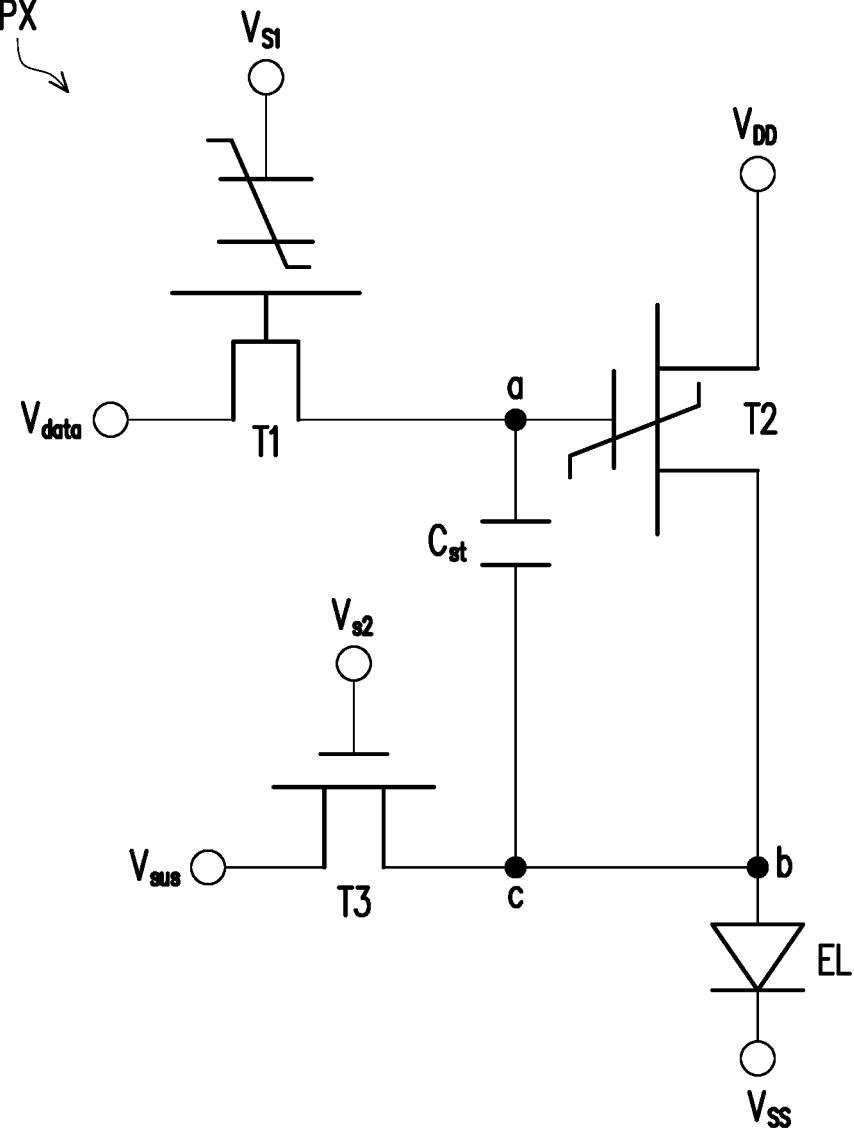
FIG. 5 is a schematic diagram of an equivalent circuit of a pixel circuit of an embodiment according to the present invention.

FIG. 5 is a schematic diagram of an equivalent circuit of a pixel circuit of an embodiment according to the present invention. The pixel circuit PX in FIG. 5 is, for example, the pixel circuit PX on the active device substrate in any of the aforementioned embodiments.

Referring to FIG. 5, the pixel circuit PX includes a first semiconductor device T1, a second semiconductor device T2, a third semiconductor device T3, a storage capacitance Cst. and a light emitting device EL.

The first semiconductor device T1 can be used as a switch transistor. The first gate of the first semiconductor device T1 is electrically connected to the voltage $V_{S1}$ (for example, the scan line voltage), the first drain (or first source) of the first semiconductor device T1 is electrically connected to the voltage V data (for example, the data line voltage), and the first source (or first drain) of the first semiconductor device T1 is electrically connected to the first node a.

The second semiconductor device T2 has the functions of a driver transistor and a memory. The second gate of the second semiconductor device T2 is electrically connected to the first node a. The second drain of the second semiconductor device T2 is electrically connected to the voltage $V_{DD}$, and the second source of the second semiconductor device T2 is electrically connected to the second node b.

The third semiconductor device T3 can be used as a sensor transistor, for example. The third gate of the third semiconductor device T3 is electrically connected to the voltage $V_{S2}$, the third drain of the third semiconductor device T3 is electrically connected to the third node c, and the third source of the third semiconductor device T3 is electrically connected to the voltage Vsus. The voltage $V_{S2}$ is used to control the switching of the third semiconductor device T3, so as to transmit the data of the driving current to the external chip through the third semiconductor device T3.

One end of the storage capacitance Cst is electrically connected to the first node a, and the other end of the storage capacitance Cst is electrically connected to the third node c. The second node b is electrically connected to the third node c. Since the second gate of the second semiconductor device T2 is electrically connected to the storage capacitance Cst, even if the first semiconductor device T1 is turned off, the second semiconductor device T2 can still be continuously turned on for a short time.

One end of the light emitting device EL is electrically connected to the second node b, and the other end of the light emitting device EL is electrically connected to the voltage Vss. The brightness of the light-emitting element EL varies depending on the magnitude of the driving current passing through the second semiconductor element T2. The light emitting device EL is, for example, a micro light emitting diode, an organic light emitting diode or other light emitting device.

In this embodiment, at the first node a, the first source (or first drain) of the first semiconductor device T1, the second gate of the second semiconductor device T2 and one end of and storage capacitance Cst are electrically connected to each other. At the second node b, the second source of the second semiconductor device T2 and one end of the light emitting device EL is electrically connected to each other. At the third node c, the third drain of the third semiconductor device T3 and the other end of storage capacitance Cst are electrically connected to each other. The third drain of the third semiconductor device T3 is electrically connected to the second source of the second semiconductor device T2 through the third node c and the second node b.

Figure 6:
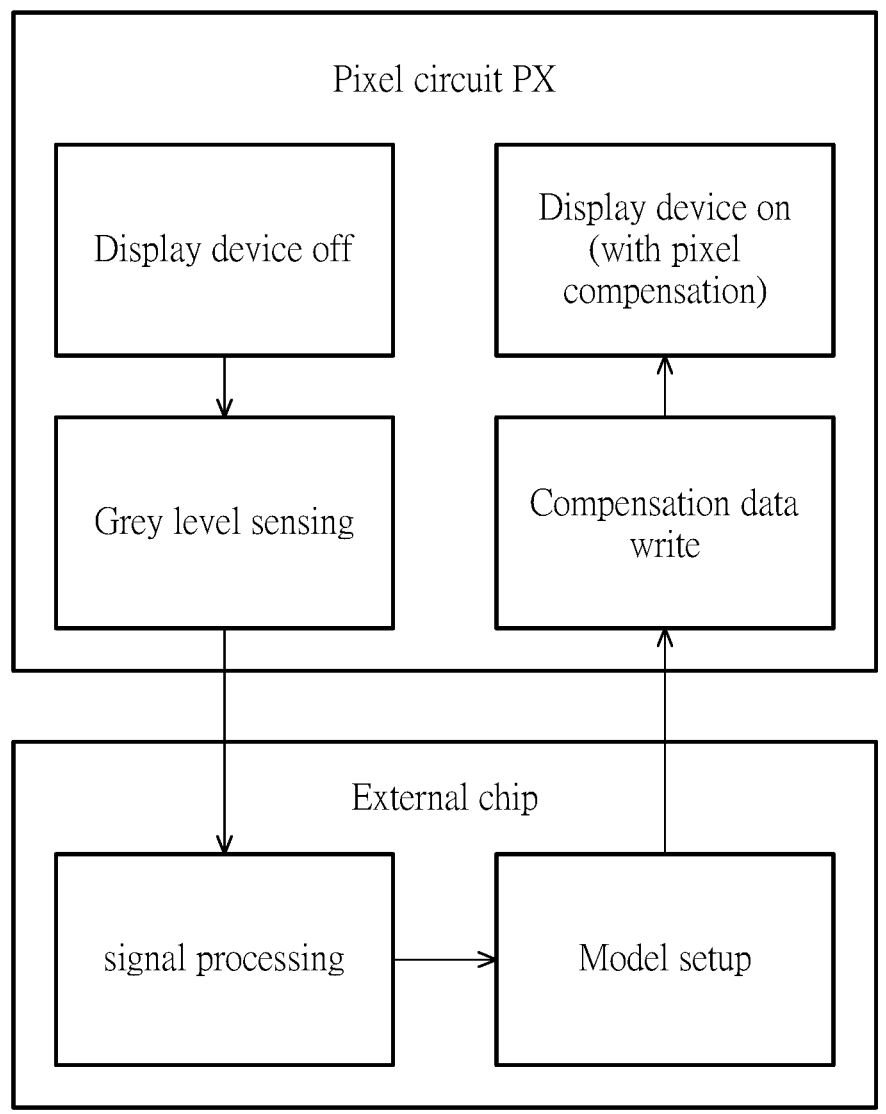
FIG. 6 is an operation flow chart of a pixel compensation of a display device having the pixel circuit configuration depicted in FIG. 5 according to an embodiment of the present invention.

FIG. 6 is an operation flow chart of a pixel compensation of a display device having the pixel circuit configuration depicted in FIG. 5 according to an embodiment of the present invention.

The following briefly describes the operation of the pixel compensation of the display device having the setting of the pixel circuit PX. Referring to FIG. 5 and FIG. 6 at the same time, the display device is firstly turned off, so that the pixel circuit PX performs grey level sensing in the background. For example, the method of the gray level sensing is to turn on the first semiconductor device T1, the second semiconductor device T2 and the third semiconductor device T3, so that the driving voltage of the first semiconductor device T1 and the driving current of the second semiconductor device T2 can be transmitted to the external chip through the third semiconductor device T3.

Then, the external chip setup a corresponding model through signal processing and calculation, and then the corresponding compensation data is calculated. After that, the compensation data is written into the pixel circuit PX. For example, the first semiconductor device T1, the second semiconductor device T2 and the third semiconductor device T3 are turned on to write the compensation data calculated by the external chip into the ferroelectric material layer in the second semiconductor device T2. Specifically, the information is recorded in the second semiconductor device T2 by polarizing the ferroelectric material layer in the second semiconductor device T2. In some embodiments, the third semiconductor device T3 is turned on to reduce the voltage difference between the source and the drain of the second semiconductor device T2, or further to make no voltage difference between the source and the drain of the second semiconductor device T2.

Next, the display device is turned on. Since the compensation data has been written into the second semiconductor device T2, the magnitude of the driving current passing through the second semiconductor device T2 can be adjusted, thereby achieving the function of pixel compensation. In some embodiments, when the display device is turned on, the third semiconductor device T3 is turned off.

Base on the above, the second semiconductor device T2 of the present invention has the function of a memory, so there is no need to dispose a compensation memory in the external chip. Therefore, the overall system is simplified, and the cost is reduced.

What is claimed is:

1. An active device substrate, comprising:
   a substrate;
   a first semiconductor device, disposed above the substrate, wherein the first semiconductor device comprises:
      a first gate and a first semiconductor layer, wherein a gate dielectric structure is sandwiched between the first gate and the first semiconductor layer, wherein the gate dielectric structure comprises a stack of a portion of a gate dielectric layer and a portion of a ferroelectric material layer; and
      a first source and a first drain, electrically connected to the first semiconductor layer; and
   a second semiconductor device, disposed above the substrate, and electrically connected to the first semiconductor device, wherein the second semiconductor device comprises:
      a second gate and a second semiconductor layer, wherein another portion of the ferroelectric material layer is filled into an opening of the gate dielectric layer, and the another portion of the ferroelectric material layer is sandwiched between the second gate and the second semiconductor layer; and
      a second source and a second drain, electrically connected to the second semiconductor layer.

2. The active device substrate of claim 1, wherein a distance between the first gate and the first semiconductor layer is greater than a distance between the second gate and the second semiconductor layer, wherein the ferroelectric material layer is in contact with the first gate, the second gate and the second semiconductor layer, and the ferroelectric material layer is separated from the first semiconductor layer.

3. The active device substrate of claim 1, wherein the ferroelectric material layer is extending from between the first gate and the gate dielectric layer to between the second gate and the second semiconductor layer.

4. The active device substrate of claim 1, wherein the ferroelectric material layer is surrounding the first source, the first drain, the second source and the second drain.

5. The active device substrate of claim 1, wherein the first source, the first drain, the second source and the second drain are penetrating through the ferroelectric material layer.

6. The active device substrate of claim 1, wherein a sub-threshold swing of the first semiconductor device is less than 60 mV/dec.

7. The active device substrate of claim 1, wherein a material of the ferroelectric material layer comprises $Ni_xMg_yZn_{0.98-y}O$ or $Hf_zZr_{1-z}O_2$, wherein x is in a range from 0.01 to 0.05, y is in a range from 0.05 to 0.15, and z is in a range from 0.4 to 0.6.

8. The active device substrate of claim 1, wherein a thickness of the ferroelectric material layer is in a range from 5 nm to 50 nm, a thickness of the gate dielectric layer is in a range from 50 nm to 100 nm, and a length of the opening of the gate dielectric layer is less than a length of the second semiconductor layer.

9. The active device substrate of claim 1, further comprising:

a third semiconductor device, disposed above the substrate, and electrically connected to the second semiconductor device, wherein the third semiconductor device comprises:

a third gate and a third semiconductor layer, wherein another portion of the gate dielectric layer is sandwiched between the third gate and the third semiconductor layer; and a third source and a third drain, electrically connected to the third semiconductor layer.

10. The active device substrate of claim 9, wherein the first drain is electrically connected to the second gate, and the third drain is electrically connected to the second source.

11. A manufacturing method of an active device substrate, comprising:

forming a first semiconductor layer and a second semiconductor layer above a substrate;

forming a gate dielectric layer on the first semiconductor layer, wherein the gate dielectric layer has an opening;

forming a ferroelectric material layer on the gate dielectric layer and the second semiconductor layer;

forming a first gate and a second gate on the ferroelectric material layer, wherein a gate dielectric structure is sandwiched between the first gate and the first semiconductor layer, wherein the gate dielectric structure comprises a stack of a portion of the gate dielectric layer and a portion of the ferroelectric material layer, wherein another portion of the ferroelectric material layer is sandwiched between the second gate and the second semiconductor layer, and the another portion of the ferroelectric material layer is filled into the opening of the gate dielectric layer;

forming a first source and a first drain electrically connected to the first semiconductor layer; and forming a second source and a second drain electrically connected to the second semiconductor layer, wherein a first semiconductor device comprises the first gate, the first semiconductor layer, the gate dielectric structure, the first source and the first drain, and a second semiconductor device is electrically connected to the first semiconductor device and comprises the second gate, the second semiconductor layer, the another portion of the ferroelectric material layer, the second source and the second drain.

12. The manufacturing method of the active device substrate of claim 11, further comprising:

using the first gate and the second gate as a mask, performing a doping process on the first semiconductor layer and the second semiconductor layer.

13. The manufacturing method of the active device substrate of claim 11, wherein the another portion of the ferroelectric material layer is filled into the opening to contact the second semiconductor layer, the ferroelectric material layer is in contact with the first gate and the second gate, and the ferroelectric material layer is separated from the first semiconductor layer.

14. The manufacturing method of the active device substrate of claim 11, further comprising:

forming a third semiconductor layer above the substrate, wherein the first semiconductor layer, the second semiconductor layer and the third semiconductor layer are formed simultaneously;

forming the gate dielectric layer on the third semiconductor layer;

forming a third gate on the gate dielectric layer, wherein the first gate, the second gate and the third gate are formed simultaneously; and forming a third source and a third drain electrically connected to the third semiconductor layer, wherein the first source, the first drain, the second source, the second drain, the third source and the third drain are formed simultaneously.

* * * * *